United States Patent
U'Ren

(10) Patent No.: US 6,797,578 B1
(45) Date of Patent: Sep. 28, 2004

(54) METHOD FOR FABRICATION OF EMITTER OF A TRANSISTOR AND RELATED STRUCTURE

(75) Inventor: Gregory D. U'Ren, Corona del Mar, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/437,723

(22) Filed: May 13, 2003

(51) Int. Cl.⁷ .......................................... H01L 21/331
(52) U.S. Cl. .................. 438/309; 438/320; 438/364; 438/552
(58) Field of Search ................................. 438/309, 320, 438/364, 552

(56) References Cited

U.S. PATENT DOCUMENTS 6,362,066 B1 * 3/2002 Ryum et al. ............... 438/364

* cited by examiner

Primary Examiner—Luan Thai
(74) Attorney, Agent, or Firm—Farjami & Farjami LLP

(57) ABSTRACT

A disclosed embodiment is a method for fabricating an emitter structure, comprising a step of conformally depositing an undoped polysilicon layer in an emitter window opening and over a base. Next, a doped polysilicon layer is non-conformally deposited over the undoped layer. Thereafter, the steps of conformally depositing an undoped polysilicon layer and non-conformally depositing a doped polysilicon layer are repeated until the emitter window opening is filled. The method can further comprise a step of activating dopants. In another embodiment, an emitter structure is fabricated according to the above method.

12 Claims, 5 Drawing Sheets

METHOD FOR FABRICATION OF EMITTER OF A TRANSISTOR AND RELATED STRUCTURE

BACKGROUND OF THE INVENTION

1. Field of the Invention

The present invention is generally in the field of semiconductor fabrication. More particularly, the invention is in the field of fabricating emitter structures in transistors.

2. Background Art

In silicon-germanium ("SiGe") heterojunction bipolar transistor ("HBT") technology, one approach to formation of an emitter in the SiGe HBT includes filling an emitter window opening with polysilicon material. One conventional method of filling the emitter window opening with polysilicon material comprises depositing undoped polysilicon into the emitter window opening, implant doping the polysilicon, and activating the dopants in the polysilicon.

Disadvantageously, the aforementioned method for fabricating SiGe HBTs can produce transistors having different characteristics depending on emitter window widths. Polysilicon deposits relatively conformally within an emitter window opening having a wide emitter window width. However, an unwanted "plug effect" can occur for emitters having narrow emitter window widths. The plug effect refers to non-conformal deposition of undoped polysilicon within a narrow emitter window, resulting in a higher thickness of polysilicon in the center of the emitter window relative to the emitter window sidewalls; hence resembling a "plug" in the narrow emitter window. The plug effect, combined with implant doping of the emitter, also result in a difference in the doping profile in the emitter and base of transistors having narrow emitter windows relative to transistors having wide emitter windows.

Another disadvantage of the conventional methods occurs due to the implant doped polysilicon being in direct contact with the base. Activating dopants in the implant doped polysilicon produces a difficult-to-control diffusion into the base, which degrades HBT performance.

Therefore, a need exists for fabricating transistors, such as SiGe HBTs, having substantially similar characteristics regardless of the emitter window width, and for controlled diffusion of dopants into the base, to achieve improved performance.

SUMMARY OF THE INVENTION

The present invention is directed to method for fabrication of emitter of a transistor and related structure. The invention resolves the need in the art for fabricating transistors, such as SiGe HBTs, having substantially similar characteristics regardless of the emitter window width, and for controlled diffusion of dopants into the base, thus achieving improved performance.

According to one embodiment, the present invention is a method for fabricating an emitter structure, comprising a step of conformally depositing an undoped polysilicon layer in an emitter window opening and over a base. Next, a doped polysilicon layer is non-conformally deposited over the undoped layer. Thereafter, the steps of conformally depositing an undoped polysilicon layer and non-conformally depositing a doped polysilicon layer are repeated until the emitter window opening is filled. The method can further comprise a step of activating dopants. In other embodiments, the present invention is a structure fabricated according to the above method. Other features and advantages of the present invention will become more readily apparent to those of ordinary skill in the art after reviewing the following description and accompanying drawings.

DETAILED DESCRIPTION OF THE INVENTION

The present invention is directed to method for fabrication of emitter of a transistor and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
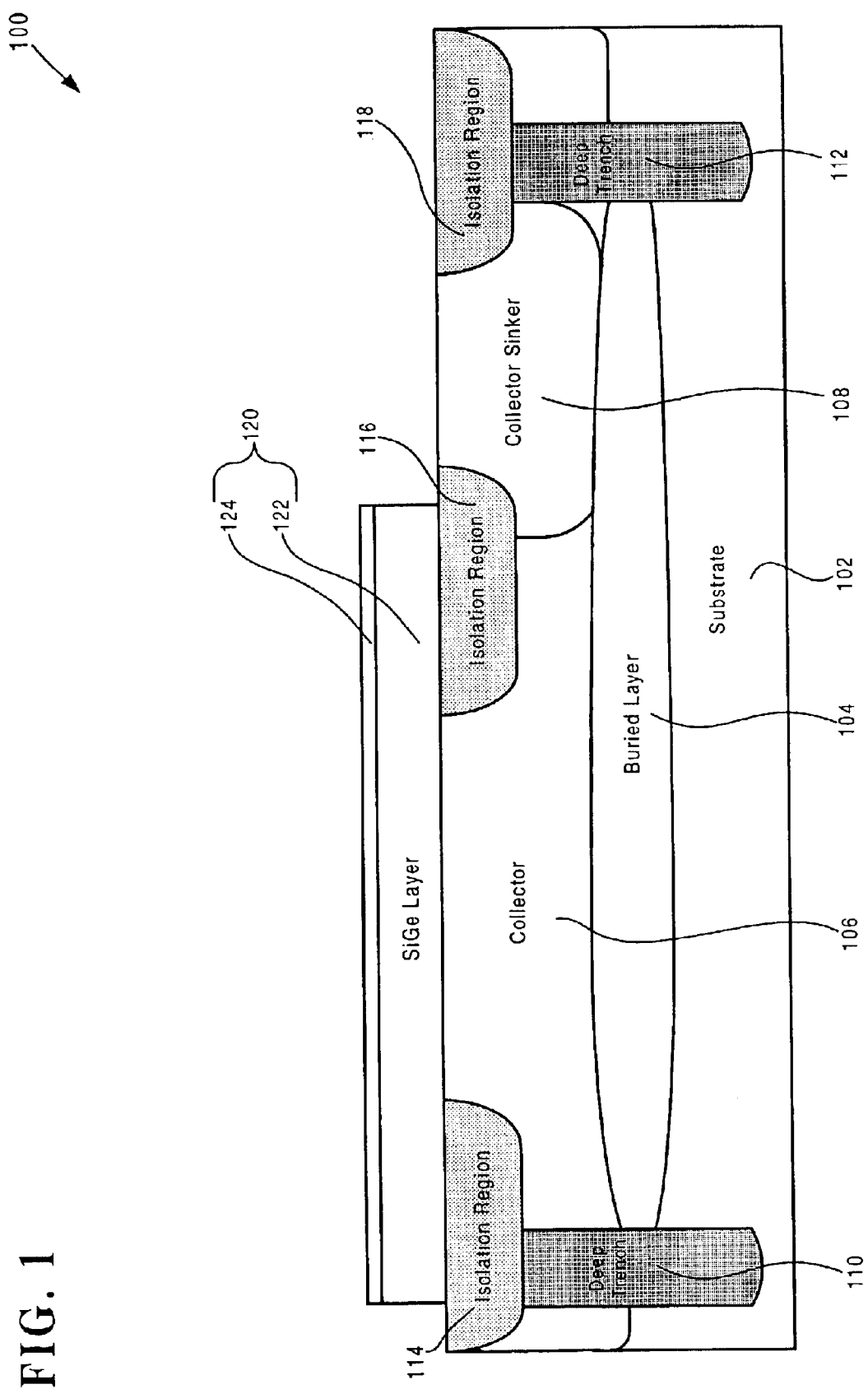
FIG. 1 shows a cross-sectional view of some of the features of an exemplary SiGe HBT structure prior to application of the steps taken to implement an embodiment of the present invention.

FIG. 1 shows a cross-sectional view of various features and components of an exemplary SiGe HBT structure prior to application of the steps taken to implement an embodiment of the present invention. Certain details and features have been left out which are apparent to a person of ordinary skill in the art. Structure 100 includes, among other things, substrate 102, buried layer 104, collector 106, collector sinker 108, deep trenches 110, 112, isolation regions 114, 116, 118 and base 120. Buried layer 104 is situated in substrate 102, which can be formed by implant doping. Collector sinker 108 is situated above, and in contact with, buried layer 104. Collector sinker 108 can be formed by diffusion of heavily concentrated dopants from the surface of collector sinker 108 down to buried layer 104. Buried layer 104 and collector sinker 108 comprise N+ type material, i.e. relatively heavily doped N type material. Buried layer 104 and collector sinker 108, provide a low resistance electrical path from collector 106 to a collector contact (not shown in any of the Figures).

As shown in FIG. 1, collector 106 is situated over, and is in contact with, buried layer 104. Collector 106 comprises N type single crystalline silicon, which can be deposited epitaxially using a reduced pressure chemical vapor-deposition ("RPCVD") process. Base 120 includes P type silicon-germanium. Base 120 comprises silicon cap layer 124 and SiGe layer 122. SiGe layer 122 of base 120 is situated on top of collector 106 and isolation regions 114, 116. Silicon cap layer 124 of base 120 is situated on top of SiGe layer 122. Referring to FIG. 1, deep trench structures 110, 112 and isolation regions 114, 116, 118 provide electrical isolation from other devices on substrate 102. Deep trench structures 110, 112 are formed in substrate 102. Isolation regions 114, 116, is 118 can be formed, for example, by a shallow trench isolation ("STI") process.

Figure 2:
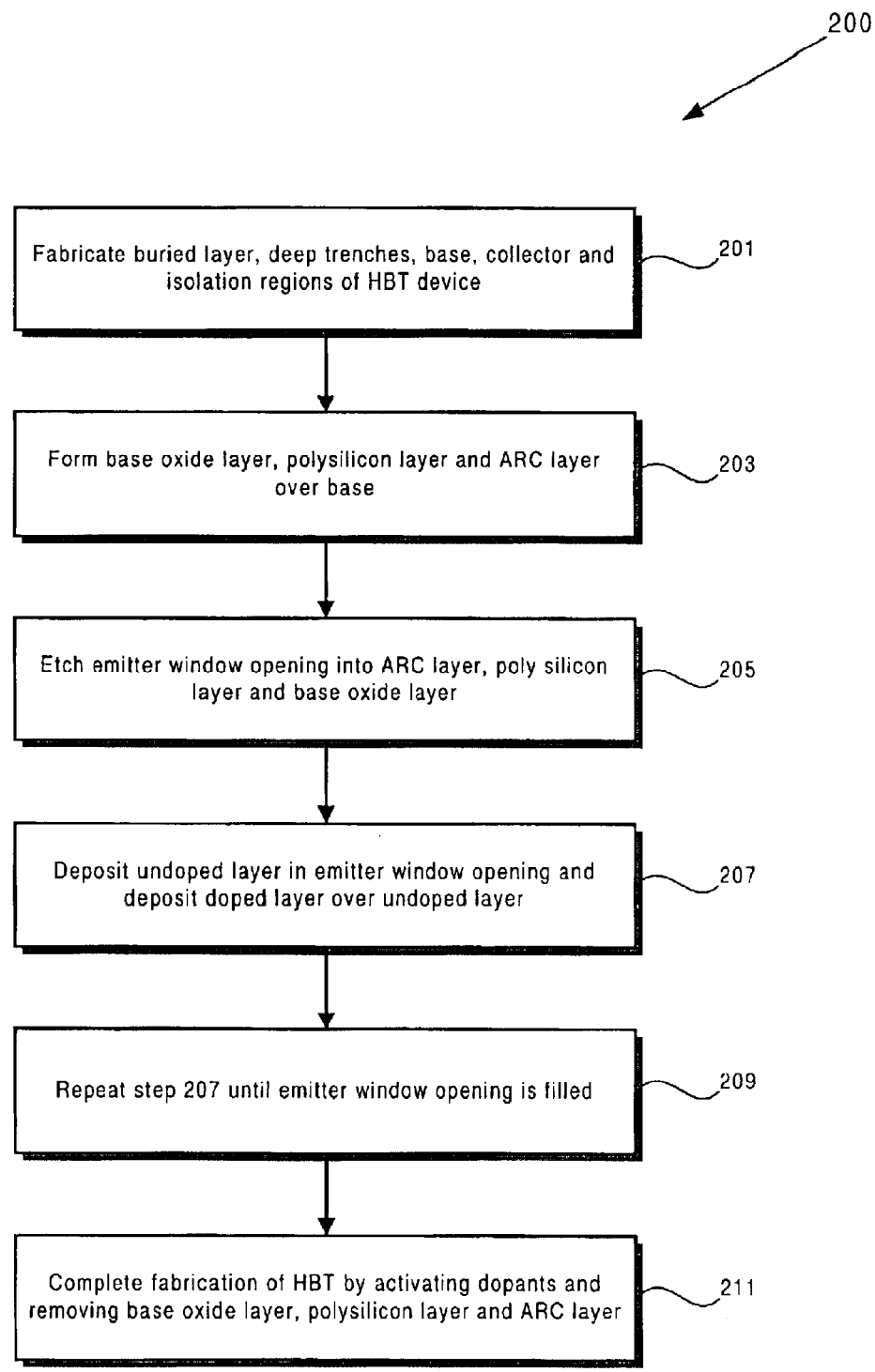
FIG. 2 shows a flowchart illustrating exemplary steps taken to implement an embodiment of the invention.

FIG. 2 shows a flowchart illustrating exemplary process steps taken to implement an embodiment of the invention. Certain details and features have been left out of flowchart 200 of FIG. 2 that are apparent to a person of ordinary skill in the art. For example, a step may consist of one or more sub-steps or may involve specialized equipment or materials, as known in the art. While steps 201 through 211 indicated in flowchart 200 are sufficient to describe one embodiment of the present invention, other embodiments of the invention may utilize steps different from those shown in flowchart 200. It is noted that the exemplary steps shown in flowchart 200 are performed on a wafer which, prior to step 201, includes a silicon substrate. FIGS. 3A–3E show cross-sectional views of some of the features of a SiGe HBT in intermediate stages of fabrication, formed in accordance with an exemplary embodiment of the invention corresponding to the exemplary steps shown in flowchart 200. These intermediate stages are described in greater detail further below in relation to flowchart 200 of FIG. 2.

Figure 3A:
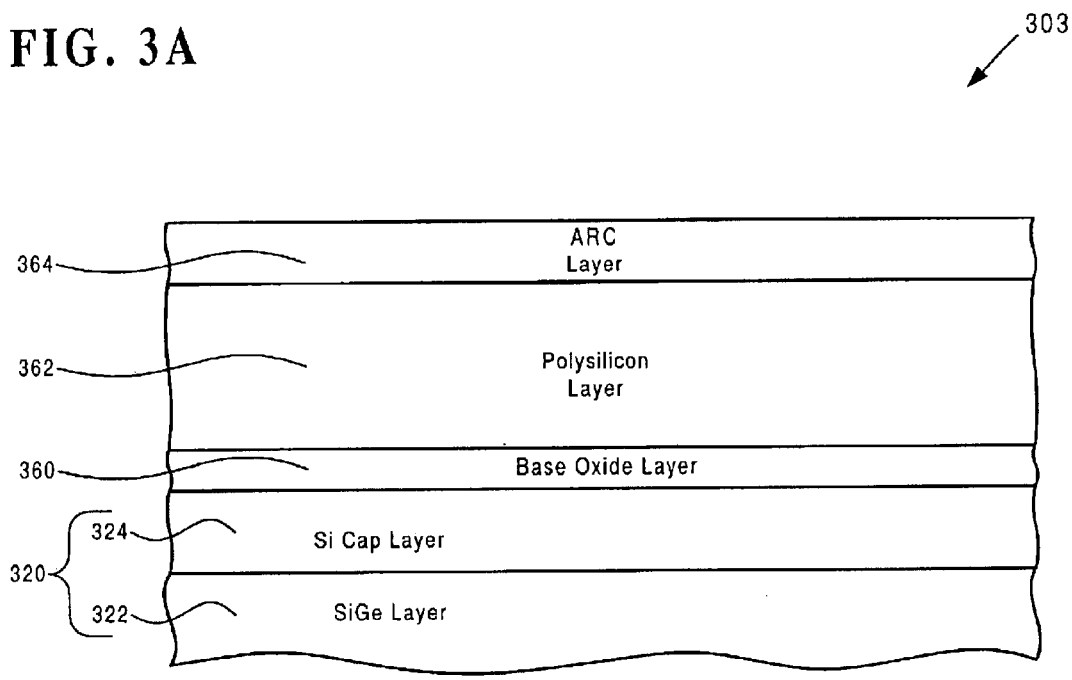
FIG. 3A shows a cross-sectional view of some of the features of an exemplary SiGe HBT after performance of step 203 in FIG. 2, formed in accordance with one embodiment of the invention.

Referring to FIG. 2, at step 201 in flowchart 200, a buried layer, deep trenches, a collector, isolation regions and a base, are formed over a P type silicon substrate. The relevant portion of the base, formed in step 201, is shown as base 320 in FIG. 3A. As shown in FIG. 3A, base 320 comprises silicon cap layer 324 and SiGe layer 322. Base 320, silicon cap layer 324 and SiGe layer 322 in FIG. 3A are analogous to base 120, silicon cap layer 124 and SiGe layer 122 in FIG. 1, respectively.

Referring to both FIG. 2 and structure 303 in 3A, at step 203 in flowchart 200, base oxide layer 360, polysilicon layer 362 and anti-reflective coating ("ARC") layer 364 are formed over base 320. Base oxide layer 360, which comprises silicon oxide in the present embodiment, is situated over silicon cap layer 324 of base 320. Polysilicon layer 362 is situated over base oxide layer 360 while ARC layer 364 is situated over polysilicon layer 362. ARC layer 364 comprises anti-reflective material such as silicon oxynitride.

Figure 3B:
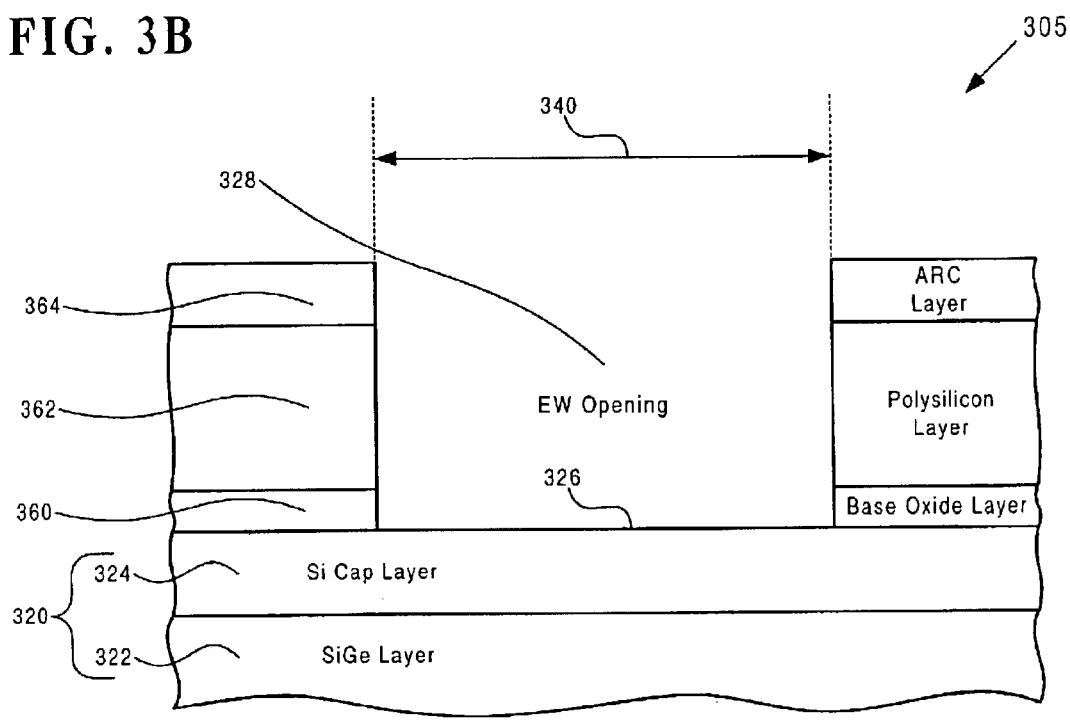
FIG. 3B shows a cross-sectional view of some of the features of an exemplary SiGe HBT after performance of step 205 in FIG. 2, formed in accordance with one embodiment of the invention.

Referring to FIGS. 2 and 3B, at step 205 in flowchart 200, emitter window opening 328 is etched into ARC layer 364, polysilicon layer 362 and base oxide layer 360 to expose top surface 326 of silicon cap layer 324 of structure 305. ARC layer 364 and polysilicon layer 362 can be etched by a dry etch process such as a chlorine dry etch process or a fluorine dry etch process. Base oxide layer 360 can be etched by a wet etch process such as an HF wet etch process. In one exemplary embodiment, emitter window opening 328 has an emitter window width 340 which is approximately 0.25 microns.

Figure 3C:
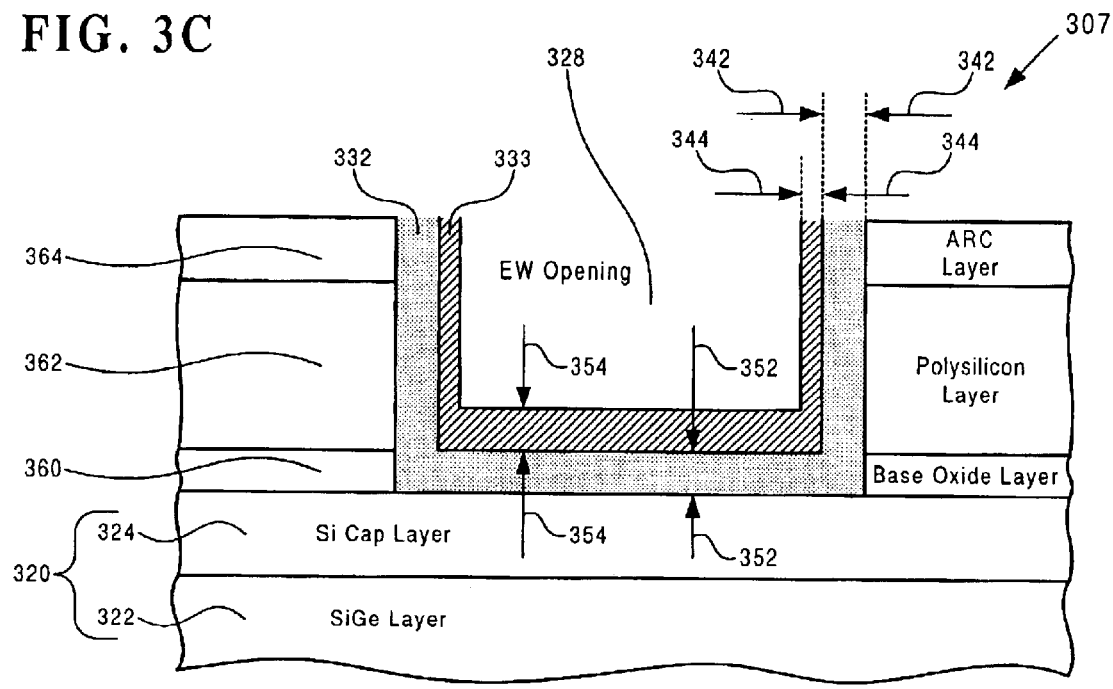
FIG. 3C shows a cross-sectional view of some of the features of an exemplary SiGe HBT after performance of step 207 in FIG. 2, formed in accordance with one embodiment of the invention.

Referring to FIGS. 2 and 3C, at step 207 in flowchart 200, undoped polysilicon layer 332 is deposited in emitter window opening 328 of structure 307. Undoped polysilicon layer 332 deposits conformally within emitter window opening 328, and thus, undoped polysilicon layer 332 has bottom thickness 352 that is approximately equal to thickness 342 at the sidewalls. In one embodiment, bottom thickness 352 and thickness 342 at the sidewalls are each equal to approximately 250 Angstroms. Further at step 207 in flowchart 200, N type doped polysilicon layer 333 is deposited in emitter window opening 328 and over undoped polysilicon layer 332 of structure 307. In one embodiment, doped polysilicon layer 333 comprises polysilicon doped with arsenic. Due to presence of dopants, such as arsenic, doped polysilicon layer 333 deposits non-conformally within emitter window opening 328 and over undoped polysilicon layer 332. In other words, doped polysilicon layer 333 deposits more rapidly at the bottom of emitter window opening 328 than at the sidewalls of emitter window opening 328. As shown in structure 307 of FIG. 3C, doped polysilicon layer 333 has bottom thickness 354 that is greater than thickness 344 at the sidewalls. In one embodiment, bottom thickness 354 is equal to approximately twice thickness 344 at the sidewalls. For example, in one embodiment, bottom thickness 354 is equal to approximately 200 Angstroms while sidewall thickness 344 ranges from approximately 80 to 100 Angstroms. In one embodiment, bottom thickness 352 of the undoped polysilicon layer is slightly greater than bottom thickness 354 of the doped polysilicon layer. For example, in one embodiment, bottom thickness 352 is equal to approximately 250 Angstroms while bottom thickness 354 is equal to approximately 200 Angstroms.

Figure 3D:
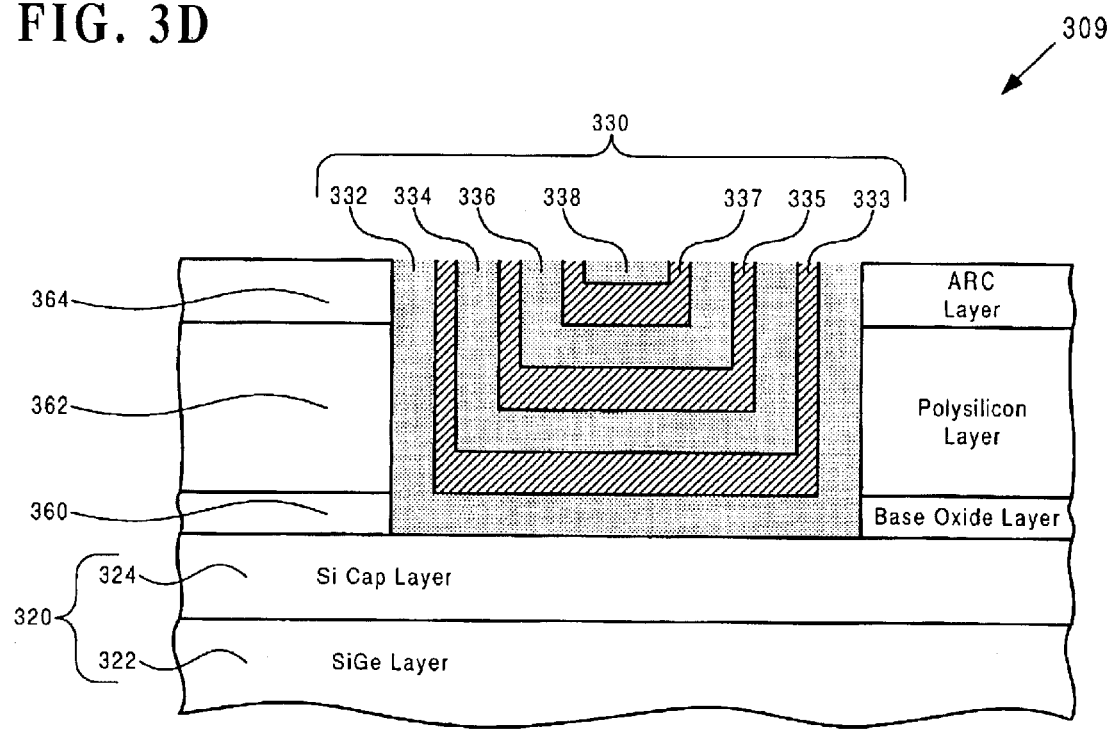
FIG. 3D shows a cross-sectional view of some of the features of an exemplary SiGe HBT after performance of step 209 in FIG. 2, formed in accordance with one embodiment of the invention.

Referring to FIGS. 2 and 3D, at step 209 in flowchart 200, step 207 is repeated, as necessary, until emitter window opening 328 in FIGS. 3B–3C is filled, which forms emitter 330. As shown in FIG. 3D, structure 309 includes emitter 330, which comprises multiple alternating layers of undoped and doped polysilicon. Emitter 330 comprises undoped polysilicon layers 332, 334, 336, 338 and doped polysilicon layers 333, 335, 337. During step 209, the sub-step of depositing a doped layer over an undoped layer of step 207 can be omitted if the emitter window opening 328 is completely filled by the previous sub-step of depositing an undoped layer. For example, emitter 330 includes undoped polysilicon layer 332 and corresponding doped polysilicon layer 333, undoped polysilicon layer 334 and corresponding doped polysilicon layer 335, undoped polysilicon layer 336 and corresponding doped polysilicon layer 337, and undoped layer 338, which does not have a corresponding doped polysilicon layer because formation of emitter 330 is completed by undoped layer 338. Forming emitter 330 in this "in-situ" manner, i.e. forming alternating layers of undoped and doped polysilicon uninterruptedly in the same chamber, advantageously facilitates uniformity of emitters having different emitter window widths and results in a more accurate control over the doping profile in the emitter, better control over emitter dopant diffusion into the base, prevention of the "plug effect" and elimination of the need for implant doping the emitter. Thus, the present invention results in HBTs having substantially similar transistor characteristics regardless of variations in emitter window widths.

In one embodiment, the undoped layers, e.g. undoped layers 332, 334, each have bottom and sidewall thicknesses of approximately 250 Angstroms. The doped layers, e.g. doped layers 333, 335, each have a bottom thickness equal to approximately 200 Angstroms and a thickness at the sidewalls ranging from approximately 80 to approximately 100 Angstroms. In one embodiment, emitter window width 340 is equal to approximately 0.25 microns. Thus, at step 209 of flowchart 200, step 207 of flowchart 200 is repeated several times to fill emitter window opening 328.

Figure 3E:
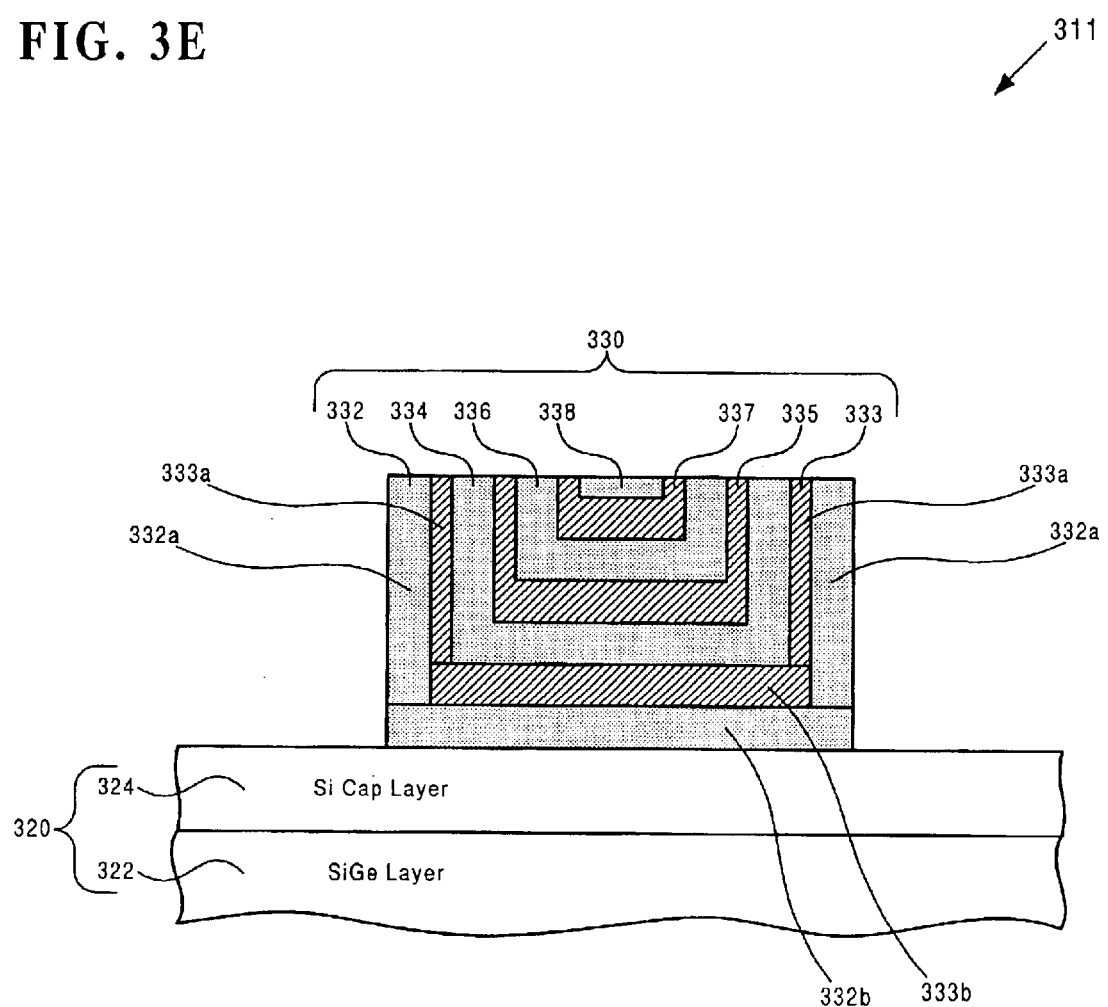
FIG. 3E shows a cross-sectional view of some of the features of an exemplary SiGe HBT after performance of step 211 in FIG. 2, formed in accordance with one embodiment of the invention.

Referring to FIG. 3E, emitter 330 is shown as comprising multiple alternating layers of undoped and doped polysilicon, each of which can be represented as comprising a sidewall and a bottom. For example, undoped layer 332 can be represented as comprising undoped sidewall 332a and undoped bottom 332b and doped layer 333 can be represented as comprising doped sidewall 333a and doped bottom 333b. Referring to FIGS. 2 and 3E, at step 211 in flowchart 200, fabrication of the HBT device is completed by activating dopants in emitter 330 and removing base oxide layer 360, polysilicon layer 362 and ARC layer 364 of structure 311. Dopants, e.g. arsenic, in doped layers of emitter 330, e.g. doped layers 333, 335, 337, can be activated by a rapid thermal processing ("RTP") process. The configuration of emitter 330 with undoped layer 332 being directly in contact with base 320, followed by alternating layers of doped and undoped polysilicon, advantageously facilitates a controlled diffusion of dopants into base 320. One reason is that dopants from doped layers, e.g. doped layer 333, must first diffuse through undoped layers, e.g. undoped layer 332. The dopants are slowed by crystal structures within the undoped layers. As stated above, the present invention results in a more accurate control over the doping profile in the emitter, better control over emitter dopant diffusion into the base, prevention of the "plug effect" and elimination of the need for implant doping the emitter. In sum, the present invention results in HBTs having substantially similar transistor characteristics regardless of variations in emitter window widths.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, various elemental or compound semiconductors, other than doped and undoped silicon, can be used to practice the present invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method for fabrication of emitter of a transistor and related structure have been described.

What is claimed is:

1. A method for fabricating a structure in a semiconductor substrate, said method comprising steps of:

depositing an undoped layer in an emitter window opening and over a base, wherein said undoped layer is conformally deposited;

forming a doped layer over said undoped layer, wherein said doped layer is non-conformally deposited;

repeating said depositing said undoped layer step and said forming said doped layer step until said emitter window opening is filled.

2. The method of claim 1 further comprising a step of fabricating said emitter window opening prior to said step of depositing said undoped layer.

3. The method of claim 2, wherein said step of fabricating said emitter window opening comprises steps of:

forming a base oxide layer, a polysilicon layer and an ARC layer over said base;

etching said base oxide layer, said polysilicon layer and said ARC layer to form said emitter window opening.

4. The method of claim 1, wherein said method further comprises a step of activating dopants.

5. The method of claim 4, wherein said step of activating dopants comprises activating dopants by a rapid thermal processing process.

6. The method of claim 1, wherein said undoped layer has an undoped bottom thickness and an undoped sidewall thickness, and wherein said undoped bottom thickness is approximately equal to said undoped sidewall thickness.

7. The method of claim 1, wherein said doped layer has a doped bottom thickness and a doped sidewall thickness, and wherein said doped bottom thickness is greater than said doped sidewall thickness.

8. The method of claim 7, wherein said doped bottom thickness is equal to approximately twice said doped sidewall thickness.

9. The method of claim 1, wherein said based comprises silicon-germanium.

10. A method for fabricating a structure in a semiconductor substrate, said method comprising steps of:

depositing an undoped layer in an emitter window opening and over a base, wherein said undoped layer is conformally deposited;

forming a doped layer over said undoped layer, wherein said doped layer is non-conformally deposited;

repeating said depositing said undoped layer step and said forming a doped layer step until said emitter window opening is filled;

activating dopants.

11. The method of claim 10, wherein said undoped layer has an undoped bottom thickness and an undoped sidewall thickness, and wherein said undoped bottom thickness is approximately equal to said undoped sidewall thickness.

12. The method of claim 10, wherein said doped layer has a doped bottom thickness and a doped sidewall thickness, and wherein said doped bottom thickness is greater than said doped sidewall thickness.

* * * * *